Nov. 26, 1968 BEN HAPGOOD TONGUE 3,413,563

WIDE BAND TRANSISTOR AMPLIFIER

Filed Jan. 6, 1967

BEN HAPGOOD TONGUE
INVENTOR.

BY Rines and Rines

ATTORNEYS 3,413,563
WIDE BAND TRANSISTOR AMPLIFIER
Ben Hapgood Tongue, West Orange, N.J., assignor to Blonder-Tongue Laboratories, Inc., a corporation of New Jersey
Filed Jan. 6, 1967, Ser. No. 607,760
5 Claims. (Cl. 330—27)

ABSTRACT OF THE DISCLOSURE

Transistor amplifiers, preferably of the common emitter return type, are disclosed embodying critically designed voltage-divider reactance connections and substantially dissipationless feedback paths to attain wide band response with substantially uniform gain, noise figure, impedance matching and input and output capability.

Figure 1:
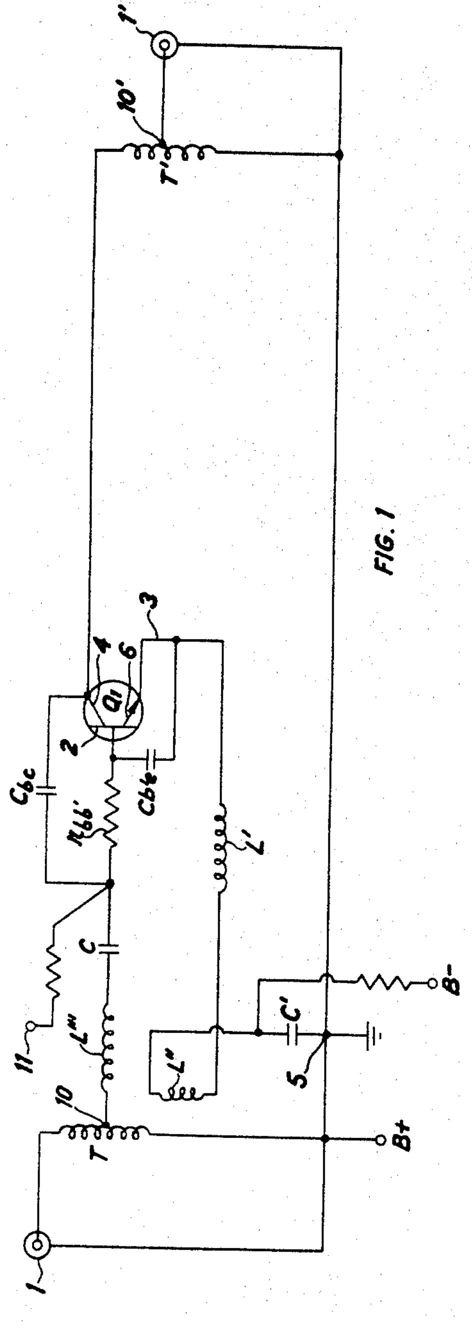

The present invention relates to transistor circuits and, more particularly, to such circuits used to amplify wide bands of radio frequencies and the like.

In circuits of the above-described character, there has been a long-standing problem to provide substantially uniform performance over wide frequency bands while simultaneously obtaining substantially uniform gain, noise figure, impedance matching and uniform input and output capability over the complete bands. Indeed, before the present invention, it is believed that the art considered the simultaneous achievement of all of these ends to be practically unattainable with simplified electronic equipment.

It has not previously been considered feasible, for example, to attain all of these ends with such techniques as amplitude equalization; i.e., introducing loss at the low end of the band and negligible loss at the high end so as to attain substantial gain equalization over the band. This is because, in such cases, the noise figure becomes degraded by the dissipation or loss inherent in amplitude-equalized circuits and components, resulting in a degraded noise figure at the low end of the band, even through uniform gain over the band can be thus attained. Other previous approaches have involved the use of series resistance and shunt high-frequency tuned circuits for decoupling such resistance at the high end but coupling the resistance at the low frequencies of the band, in order to compensate for the transistor's input resistance variation and thus attain uniform match over the band. While the loss in such resistance reduces the noise figure at the low end so as to substantially equalize with the noise figure at the high end of the band, the gain at the low end of the band still remains considerably greater than that at the high end. If, accordingly, amplitude equalization is then resorted to at the output, the gain over the band may be rendered uniform or flat, but this will be accompanied by the disadvantage that the circuit will have less input capability at the low end than at the high end.

Other approaches to the solution of the problem of simultaneously providing all of the above-described characteristics have involved common base transistor amplifiers having low input impedance and driven through, say, a 75-ohm resistance to provide a proper match over the whole band with substantially uniform or flat input capability. Unfortunately, however, this use of the driving reristance degrades the good available noise figure all over the band because of dissipation therein. In the case of common emitter amplifiers with series resistance in the emitter for current feedback and resistance from collector to base for voltage feedback, the input impedance at the high end may be raised to provide a match to, say, the 75 ohms, while the voltage feedback drops the input impedance at the low end of the band to the same impedance match. While this type of circuit can provide not only uniform matching and gain, but substantially uniform input and output capability, unfortunately, the resistors associated with the input circuit again degrade the best available noise figure at the high end and also absorb output power, reducing output capability.

It is, therefore, to the problem that has heretofore seemed substantially impossible of practical solution of reducing the low-frequency gain to be substantially equal to the high-frequency gain, while retaining input impedance match over the band and while improving the low-frequency noise figure to a value substantially no worse than the noise figure at the high end of the band, which is maintained at substantially its best or optimum possible value, and without substantial variation in the input and output capability of the amplifier over the complete band (that is, the input capability for a particular level of cross modulation—say, 30 db above 1 millivolt at 75-ohms for cross modulation 57 db down) that the present invention is primarily directed.

A primary object of the invention, accordingly, is to provide a new and improved transistor amplifier having the above-described highly advantageous but previously unattained features.

A further object is to provide a new and improved amplifier circuit of the common emitter return-path type.

Still an additional object is to provide a novel cascode transistor amplifier circuit.

A further object is to provide a novel transistor amplifier circuit having more general utiliy, as well.

Other and future objects will be explained hereinafter and will be more particularly delineated in the appended claims.

In summary, these objects are attained with novel voltage-divider reactance connections and substantially dissipationless feedback paths, including reactive means for degeneratively feeding current from the output to the input such as to provide a reflective positive conductance in the input circuit of increasing value with decreasing frequency. Preferred details are hereinafter set forth.

Figure 2:
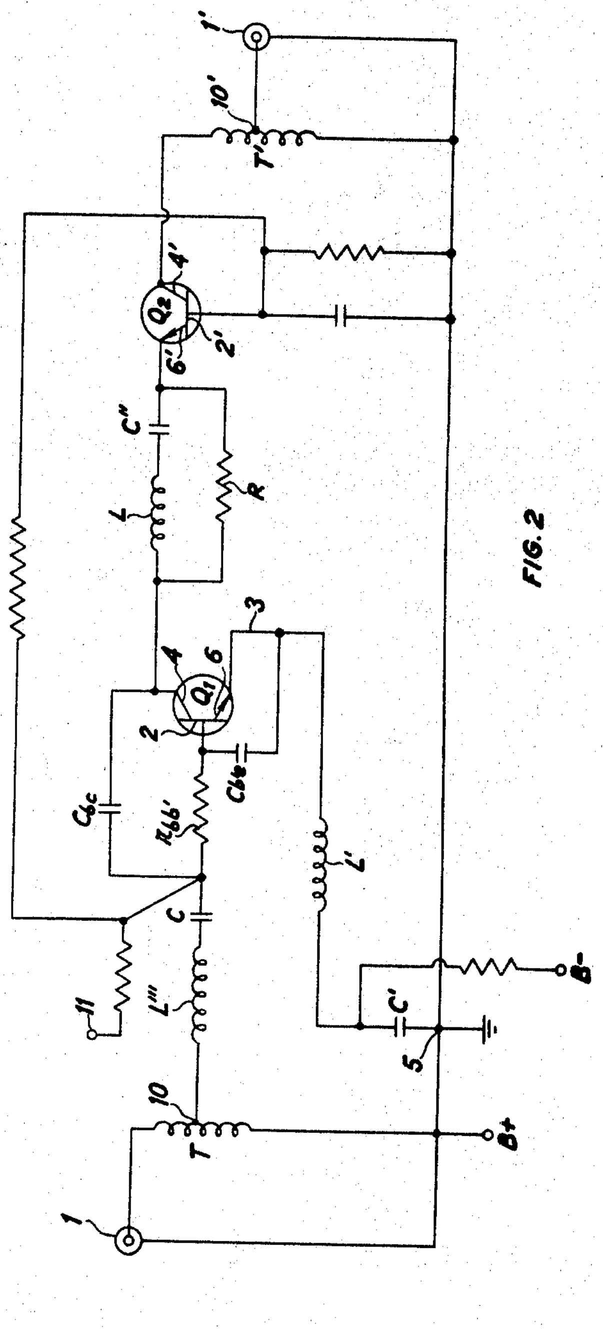

The invention will now be described with reference to the accompanying drawing, FIG. 1 of which is a schematic circuit diagram of a preferred circuit; and FIG. 2 is a similar diagram of a modification.

Referring to FIG. 1, the input circuit is shown including, for example, a 75-ohm coaxial, line 1, applying television signals in the VHF band (from 54 to 216 megacycles) to an input circuit transformer T, an intermediate tap 10 of which is connected by inductance L''' and a voltage-divider capacitor C through the inherent base resistance $r_{bb}'$ of a first transistor stage $Q_1$ to the base electrode 2 of the stage $Q_1$. The collector electrode 4 of the transistor $Q_1$ feeds an output circuit transformer T'; the intermediate terminal 10' of which is connected to the output circuit transmission line 1'. The emitter electrode 6 of the stage $Q_1$ is returned through a feedback path 3 (having inherent stray inductance L') to a terminal 5 which is common to the input and output circuits and may comprise the grounded B+ terminal. The feedback path 3 includes preferably a substantially dissipationless inductance L'' mutually coupled to the transformer T and by-passed at C' to common terminal 5. The stage $Q_1$ may thus be characterized as a common emitter return-path stage, having the common terminal 5 in both the input and output circuits.

By means of the construction above-described, it has been found that the low-frequency gain at the low end of the band (54 megacycles) may be substantially reduced to substantial equality with the gain at the high or 216 megacycle end of the band without the use of dissipation-producing resistance (though some slight resistance might be introduced to compensate for finite transistor beta or for slightly improper transformer turns ratio or the like affecting frequency response or input match), through appropriate adjustment of the capacitor C with respect to the inherent base-to-emitter capacitance $C_{b'e}$ with which it forms a voltage divider that is substantially dissipationless at the low end of the band. Appropriate adjustment of C with respect to $C_{b'e}$ will result in reducing the low-frequency gain to the value of the high-frequency gain of the stage $Q_1$. For example, with a 2N3866 type transistor, it has been found that if C is adjusted to a value of about 39 pf. (with $C_{b'e}$ being of the order of 150 pf.) sufficient voltage division takes place at the 54 megacycle low end of the television band to achieve this flat gain response. By resonating C with the series inductance L''' at the high end of the band, moreover, this voltage division circuit is effectively removed from the circuit at the high end of the band, so that the gain thereat remains unchanged. The high band noise figure has in no sense been degraded and it has remained at its best or optimum value. During this attainment of substantially equal gain at the low end, the substantial reduction in the low end noise figure to substantially the same optimum value as the high-frequency noise figure has also been achieved.

To provide the appropriate wideband input match, it will be noted that the stray inductance L' of the feedback path 3 raises the effective input resistance at the high end of the band; but the mutual inductance provided by L'' (preferably having a substantially dissipationless core), as coupled to the transformer T, provides degenerate feedback from the emitter 6 along the path 3 that introduces a reflected positive conductance in the input circuit of value that increases as the frequency decreases toward the lower end of the band. This effects the desired 75-ohm or other impedance match at the lower end of the band, again without introducing dissipative elements that prevent the equalizing of the noise figure at the low end with the best figure at the high end. The impedance matching above-discussed is provided through the inductive coupling of some of the emitter's current in such phase polarity as to cause the degeneration, this being substantially the reverse of the phase of the feedback in the normal Hartley-type oscillator. In effect, this operation couples an electronically generated low resistant into the base-to-ground circuit. By controlling the relative amount of capacitive division at C in the base circuit and the ratio of the mutual inductive coupling between L'' and T, the low end gain can be made substantially equal to the high end gain, as before stated. The absence of any substantial dissipation in effecting the low end high-band impedance matching through this feedback results in the low and high-band noise equlization, and does so while providing uniform input and output circuit capability. With the type 2N3866 transistor thusly operated in the VHF television band with 25 milliamperes of collector current, for example, the input capability (30 db above 1 millivolt for cross modulation of, say, 57 db down) has been found to remain substantially constant over the complete band of 54 to 216 megacycles.

It has also been found that the above results may be attained through other techniques for providing the reflected positive conductance in the input circuit for effecting the impedance match at the low end, as with the aid of the circuit of FIG. 2, which will be recognized as of the cascode type, embodying a grounded base second stage $Q_2$. Of course, the output circuit of FIG. 1 may be connected to a further grounded base stage to provide a cascode system, but the circuit of FIG. 2 is a little different in that the emitter 6 of the state $Q_1$ is only connected through L' to the common input-output circuit terminal 5 without the use of the mutual coupling inductance L'' in the feedback path 3. Again, however, positive conductance of value that increases with the decreasing frequency for attaining the degenerative dissipationless reactive feedback current that attains the impedance match in the low end of the band is provided, but this time through the inherent base-to-collector capacitance $C_{bc}$.

At the high end of the band, the collector 4 presents a high impedance source to the stage $Q_2$ by means of an interposed series resonant circuit LC'' (the latter being shunted by resistance R that provides the right phase of feedback), made resonant at the high end of the band, at 216 megacycles. In this case, $C_{bc}$ creates the positive component of input circuit conductance so that there is less output current from $Q_1$ aplied between the emitter 6' and base 2' of the grounded base stage $Q_2$, thereby reducing the gain of $Q_2$ at the low end of the band. The feedback through $C_{bc}$ can also aid in producing the desired impedance match at the input in view of the voltage division between C and $C_{b'e'}$, reducing the low band gain and lowering the impedance at the low end. This circuit is adjusted with the value of C'' to attain the desired input match. As above-stated, all of the conventional DC and by-pass conditions are not illustrated in FIG. 2, though they should be understood to be useful therein. Further modifications will also occur to those skilled in the art and all such are considered to fall within the spirit and scope of the invention as defined in the appended claims.

What is claimed is:

1. A transistor amplifier circuit comprising transistor means provided with base, collector and emitter electrodes for amplifying a band of frequencies ranging from low to high frequency values and of bandwidth such that the gain and noise figure of the amplifier circuit at the low-frequency end of the band are inherently normally more and less, respectively, than the gain and noise figure at the high-frequency end of the band, the circuit having, in combination, input and output circuits between which the transistor means electrodes are connected with an emitter electrode terminal being shared in common with the input and output circuits to provide a common emitter return stage; means comprising voltage-divider reactance effective at the said low-frequency end of the band and connected between the input circuit and a base electrode and adjusted to a value with respect to the inherent capacitance between the said base and emitter electrodes to reduce the said gain at the low-frequency end of the band to a value substantially equal to that at the high-frequency end and substantially without dissipation, the voltage-divider means being resonated to render it substantially ineffective at the high-frequency end of the band; means comprising a substantially dissipationless feedback path for feeding current back from said emitter electrode to the said common emitter terminal in order to raise the effective amplified input circuit resistance at the said high-frequency end of the band; and substantially dissipationless reactive means for degeneratively feeding current from the output to the input circuit such as to provide a reflected positive conductance in the input circuit of increasing value with decreasing frequency in order to provide a substantial impedance match at the input circuit at the low-frequency end of the band.

2. An amplifier circuit as claimed in claim 1 and in which the last-named means comprises mutual inductance coupled to the input circuit and disposed in the said feedback path.

3. An amplifier circuit as claimed in claim 1 wherein the last-named means comprises the base-to-collector capacitance.

4. An amplifier circuit as claimed in claim 1 and in which a common base transistor stage is provided, connected to the collector and emitter electrodes of the said common emitter stage.

5. An amplifier circuit as claimed in claim 4 and in which the connection between the common emitter stage and the common base transistor stage comprises a resonant circuit tuned to the high-frequency end of the said band and forming a cascode circuit.

References Cited

UNITED STATES PATENTS 2,681,953 6/1954 Bradburd ------------ 330—78

ROY LAKE, *Primary Examiner.*

J. B. MULLINS, *Assistant Examiner.*